(12) United States Patent  
Chen

(10) Patent No.: US 8,325,870 B2
(45) Date of Patent: Dec. 4, 2012

(54) DIGITAL PHASE-LOCKED LOOPS AND FREQUENCY ADJUSTING METHODS THEREOF

(75) Inventor: Tse-Peng Chen, Taipei (TW)

(73) Assignee: Richwave Technology Corp., Taipei (TW)

( * ) Notice: Subject to any disclaimer, the term of this patent is extended or adjusted under 35 U.S.C. 154(b) by 401 days.

(21) Appl. No.: 12/729,308

(22) Filed: Mar. 23, 2010

(65) Prior Publication Data

US 2011/0069792 A1    Mar. 24, 2011

(30) Foreign Application Priority Data

Sep. 23, 2009   (TW) ................................ 98132046 A

(51) Int. Cl.
*H03L 7/08* (2006.01)
*H03D 3/24* (2006.01)
(52) U.S. Cl. ........................ 375/376; 327/147
(58) Field of Classification Search .............. 375/326, 375/327, 373–376; 327/105, 147, 148, 151, 327/156, 157, 160
See application file for complete search history.

(56) References Cited

U.S. PATENT DOCUMENTS

| 4,975,650 | A | * | 12/1990 | Martin ............................... 327/5 |
| 5,373,255 | A | * | 12/1994 | Bray et al. ...................... 331/1 A |
| 6,484,038 | B1 | * | 11/2002 | Gore et al. .................. 455/552.1 |
| 2007/0223639 | A1 | | 9/2007 | Unterricker |
| 2008/0080656 | A1 | | 4/2008 | Wilson et al. |
| 2009/0140896 | A1 | * | 6/2009 | Adduci et al. ................. 341/131 |
| 2009/0243735 | A1 | * | 10/2009 | Luiz et al. ..................... 331/1 A |

FOREIGN PATENT DOCUMENTS

| EP | 0 590 323 | 4/1994 |
| WO | WO 01/69786 | 9/2001 |

OTHER PUBLICATIONS

European Search Report dated Jan. 31, 2011.
English language translation of abstract of EP 0 590 323 (published Apr. 6, 1994).

* cited by examiner

*Primary Examiner* — Young T. Tse
(74) *Attorney, Agent, or Firm* — McClure, Qualey & Rodack LLP

(57) ABSTRACT

A digital phase-locked loop having a phase frequency detector (PFD), a 3-state phase frequency detection converter (3-state PFD converter), a loop filter and a digital voltage-controlled oscillator is provided. The PFD receives an input frequency and a reference frequency and outputs a first signal and a second signal based on the phase difference between the input frequency and the reference frequency. The 3-state PFD converter outputs a 3-state signal according to the first and second signals, wherein the 3-state signal is presented in 1, 0 and −1. The loop filter outputs at least one control bit based on only the 3-state signal. The DCO adjusts the outputted oscillation frequency according to the control bit.

20 Claims, 5 Drawing Sheets

US 8,325,870 B2

DIGITAL PHASE-LOCKED LOOPS AND FREQUENCY ADJUSTING METHODS THEREOF

CROSS REFERENCE TO RELATED APPLICATIONS

This Application claims priority of Taiwan Patent Application No. 098132046, filed on Sep. 23, 2009, the entirety of which is incorporated by reference herein.

BACKGROUND OF THE INVENTION

1. Field of the Invention

The invention relates to a digital phase-locked loop, and more particularly, to a digital phase-locked loop having a three-state phase frequency detector (PFD).

2. Description of the Related Art

FIG. 1 is a block diagram illustrating a conventional digital phase-locked loop. As shown in FIG. 1, the phase/frequency analog-to-digital converter (PFDC) 1 receives the digital signals of square waves I1 and I2 and detects the phase difference value ($\Delta\psi$) between these two digital signals. The phase difference value is obtained as analog information, and the phase/frequency analog-to-digital converter 1 needs to convert the analog information into digital information for the filter 2. Since the phase difference value is obtained as analog information, the phase/frequency analog-to-digital converter 1 needs to be implemented with multiple bits, which may increase the cost and complexity of the circuit. Therefore, it is desired to provide a low-cost digital phase-locked loop.

BRIEF SUMMARY OF THE INVENTION

A detailed description is given in the following embodiments with reference to the accompanying drawings.

An embodiment of the invention discloses a digital phase-locked loop comprising a phase frequency detector, a three-state phase frequency detection converter, a loop filter and a digital voltage-controlled oscillator. The phase frequency detector receives an input frequency and a reference frequency and outputs a first signal and a second signal based on a phase difference between the input frequency and the reference frequency. The three-state phase frequency detection converter outputs a three-state signal according to the first and second signals, wherein the three-state signal is presented in 1, 0 and −1. The loop filter outputs at least one control bit based on only the three-state signal. The digital voltage-controlled oscillator adjusts an outputted oscillation frequency according to the control bit.

Furthermore, an embodiment of the invention discloses a frequency adjusting method for a digital phase-locked loop. The method comprises receiving an input frequency and a reference frequency and outputting a first signal and a second signal based on a phase difference between the input frequency and the reference frequency. The method further comprises outputting a three-state signal according to the first and second signals, wherein the three-state signal is presented in 1, 0 and −1. The method further comprises outputting at least one control bit based on only the three-state signal. The method further comprises adjusting an oscillation frequency outputted from the digital phase-locked loop according to the control bit.

An embodiment of the invention also discloses an integrated receiver comprising an analog receive path circuitry, a low-IF conversion circuitry, a digital signal processor, a clock system and a frequency synthesizer. The analog receive path circuitry is operated according to a mixed signal. The low-IF conversion circuitry is operated according to a digital sample clock signal. The digital signal processor is operated according to a digital clock signal. The clock system receives an oscillation frequency and generates the mixed signal, digital sample clock signal and digital clock signal. The frequency synthesizer comprises a phase frequency detector, a three-state phase frequency detection converter, a loop filter and a digital voltage-controlled oscillator. The phase frequency detector receives an input frequency and a reference frequency and outputs a first signal and a second signal based on a phase difference between the input frequency and the reference frequency. The three-state phase frequency detection converter outputs a three-state signal according to the first and second signals, wherein the three-state signal is presented in 1, 0 and −1. The loop filter outputs at least one control bit based on only the three-state signal. The digital voltage-controlled oscillator adjusts the oscillation frequency according to the control bit.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
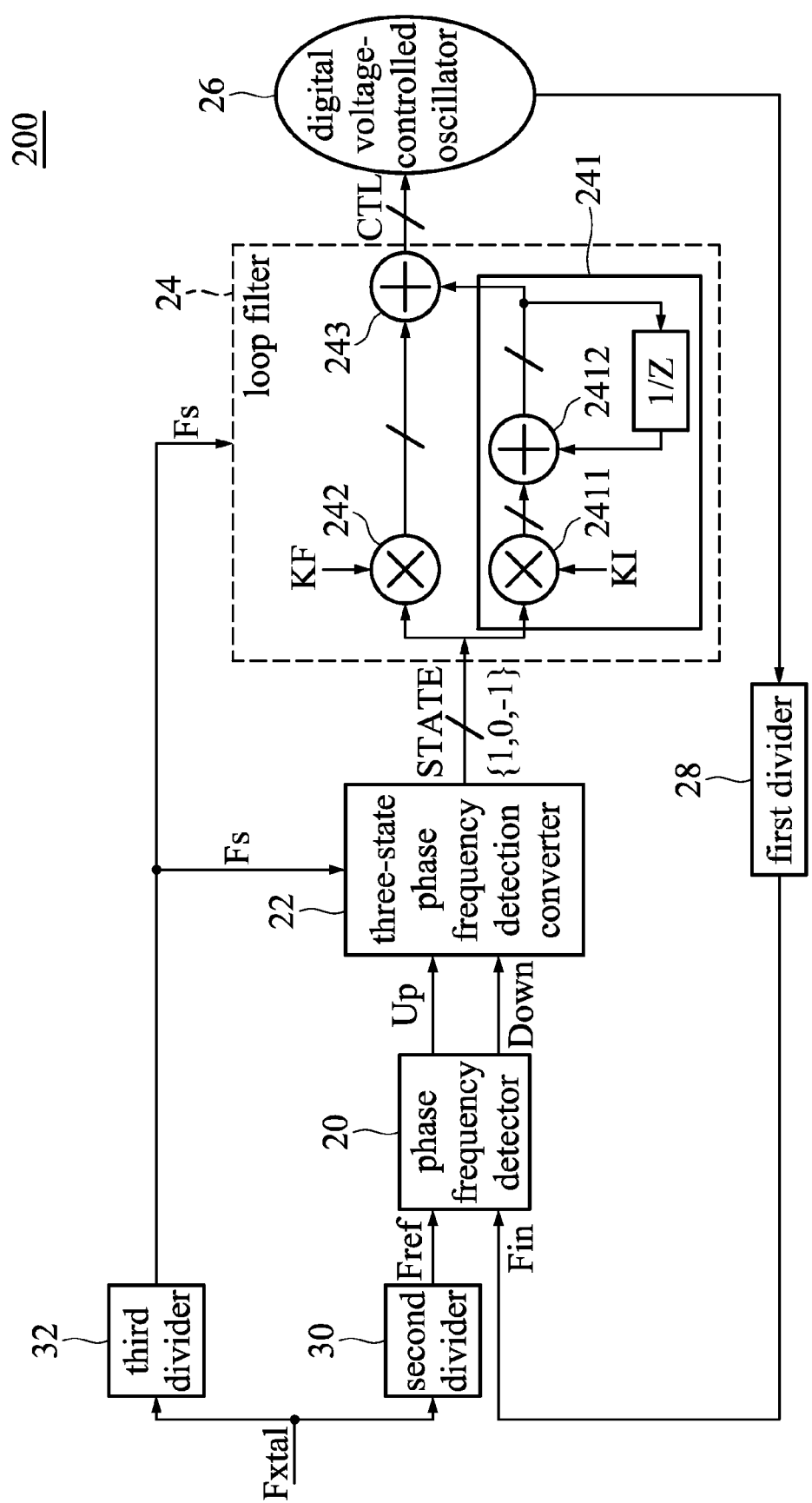
FIG. 2 is a circuit diagram illustrating an embodiment of a digital phase-locked loop according to the present invention.

FIG. 2 is a circuit diagram illustrating an embodiment of a digital phase-locked loop according to the present invention. As shown in FIG. 2, the digital phase-locked loop 200 comprises a phase frequency detector 20, a three-state phase frequency detection converter 22, a loop filter 24, a digital voltage-controlled oscillator (DCO) 26, a first divider 28, a second divider 30 and a third divider 32. In FIG. 2, a signal Fxtal may be a frequency signal generated by a crystal oscillator (not shown), and the second divider 30, which is a divide-by-M divider, divides the frequency signal Fxtal by a divisor M to obtain a reference frequency Fref. On the other hand, the first divider 28 receives an output oscillation frequency from the DCO 26 and divides the output oscillation frequency by a divisor N to obtain an input frequency Fin. The phase frequency detector 20 receives the input frequency Fin and the reference frequency Fref and outputs the Up/Down signals based on the phase difference between the input frequency Fin and the reference frequency Fref, as described in more detail in FIG. 3. For example, when the phase of the input frequency Fin lags behind that of the reference frequency Fref, the phase frequency detector 20 outputs "1" and "0" as the Up signal and the Down signal, respectively. Conversely, when the phase of the input frequency Fin leads that of the reference frequency Fref, the phase frequency detector 20 outputs "0" and "1" as the Up signal and the Down signal, respectively. The three-state phase frequency detection converter 22 outputs a three-state signal STATE according to the Up/Down signals, as described in more detail in FIG. 3. The result of the three-state signal STATE is given by the following table 1:

TABLE 1

| Three-state phase frequency detection converter | | | | |
|---|---|---|---|---|
| Up signal | 1 | 0 | 1 | 0 |
| Down signal | 0 | 1 | 1 | 0 |
| STATE | 1 | −1 | 0 | 0 |

The result of the three-state signal STATE may be dependent on the rising edge or the falling edge of a sampling frequency FS. As shown in table 1, if the Up signal is "1" and the Down signal is "0", the three-state signal STATE is determined to be "1". If the Up signal is "0" and the Down signal is "1", the three-state signal STATE is determined to be "−1". If the Up signal is "1" and the Down signal is "1", the three-state signal STATE is determined to be "0". If the Up signal is "0" and the Down signal is "0", the three-state signal STATE is determined to be "0". The three-state signal STATE equal to "1" represents that the phase of the input frequency Fin lags behind that of the reference frequency Fref, thereby having to increase the output oscillation frequency from the DCO 26. The three-state signal STATE equal to "−1" represents that the phase of the input frequency Fin leads that of the reference frequency Fref, thereby having to reduce the output oscillation frequency from the DCO 26.

The three-state phase frequency detection converter 22 then outputs the corresponding three-state signal STATE to the loop filter 24. The loop filter 24 comprises an accumulator unit 241, and the accumulator unit 241 comprises a first multiplier 2411 and a first adder 2412. After the first multiplier 2411 multiplies the three-state signal STATE by KI (i.e. first parameter), the first adder 2412 then accumulates the multiplication result of the first multiplier 2411 to obtain the output of the accumulator unit 241. Additionally, the loop filter 24 further comprises a second multiplier 242 and a second adder 243. Likewise, the second multiplier 242 multiplies the three-state signal STATE by KF (i.e. second parameter), and the second adder 243 adds the multiplication result of the second multiplier 242 with the output of the accumulator unit 241 to obtain a control bit CTL (at least one bit). Next, the loop filter 24 outputs the control bit CTL to the DCO 26. Accordingly, the DCO 26 adjusts its output oscillation frequency based on the control bit CTL outputted from the loop filter 24, to make the input frequency Fin consistent with the reference frequency Fref.

Figure 3:
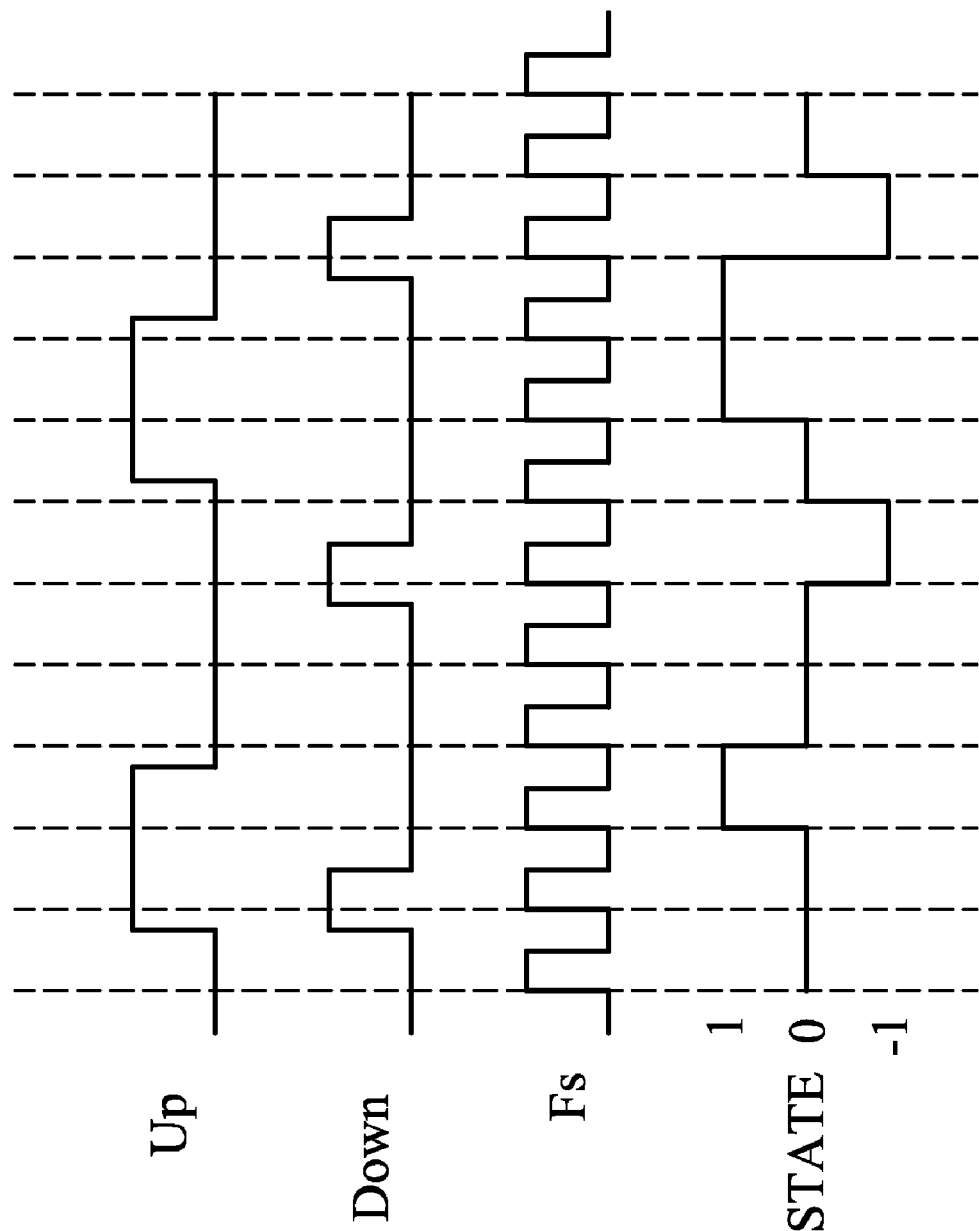
FIG. 3 is a sample schematic diagram illustrating an embodiment of a three-state signal STATE according to the present invention.

Further, in FIG. 3, the clock frequencies of the three-state phase frequency detection converter 22 and the loop filter 24 may be the frequency signal Fxtal from the crystal oscillator that is divided by a divisor X by the third divider 32, wherein the divisor X may be adjusted depending on the design requirements.

Figure 4:
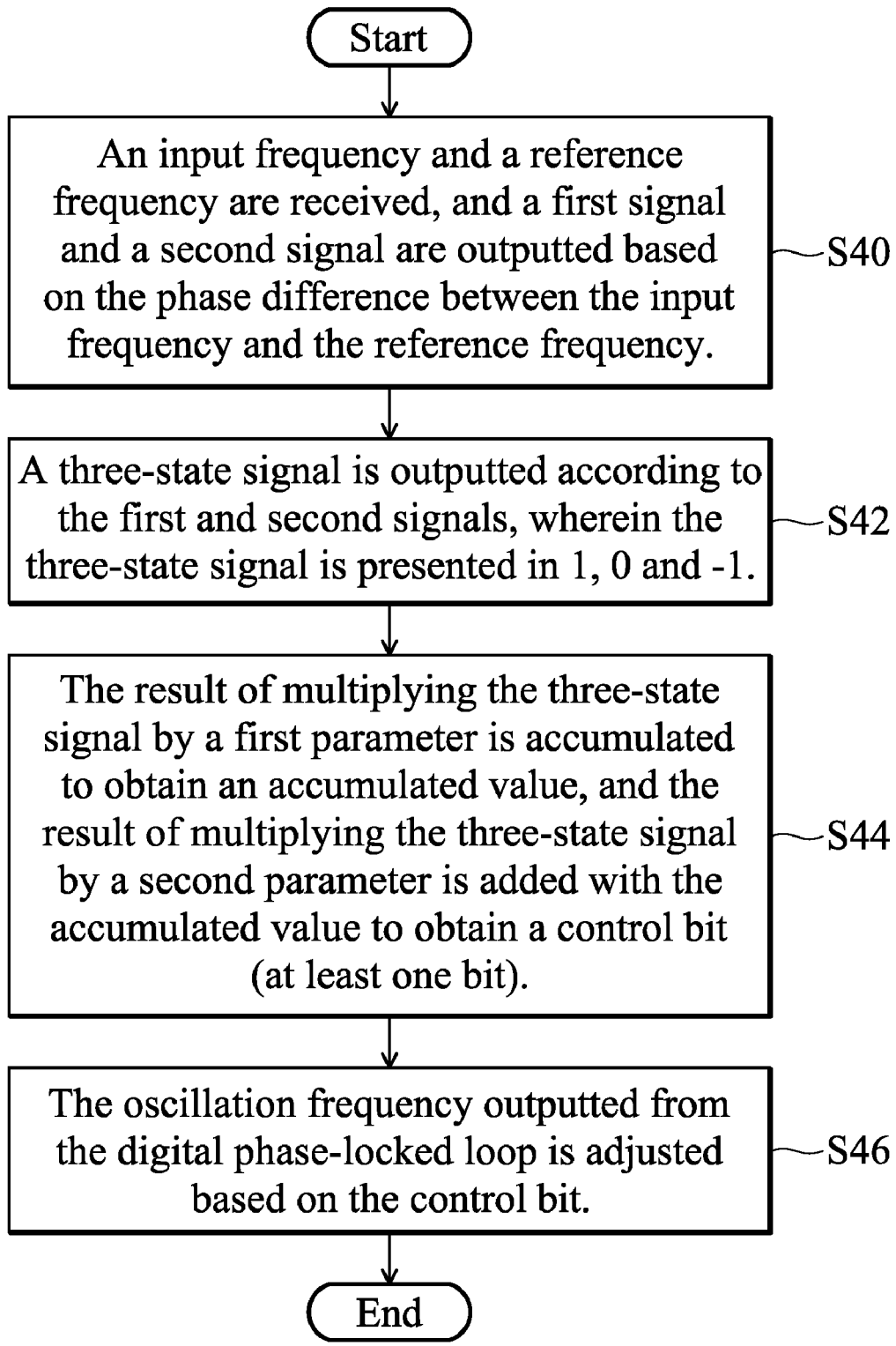
FIG. 4 is a flow chart illustrating a frequency adjusting method for a digital phase-locked loop according to the present invention.

FIG. 4 is a flow chart illustrating a frequency adjusting method for a digital phase-locked loop according to the present invention. Flow begins in step S40. In step S40, an input frequency and a reference frequency are received, and a first signal and a second signal are outputted based on the phase difference between the input frequency and the reference frequency. Specifically, the input frequency is obtained by dividing an oscillation frequency outputted from the digital phase-locked loop by a divisor N, and the reference frequency is obtained by dividing a frequency signal outputted from a crystal oscillator by a divisor M. For example, when the phase of the input frequency lags behind that of the reference frequency, the first and second signals are "1" and "0" respectively. Conversely, when the phase of the input frequency leads that of the reference frequency, the first and second signals are "0" and "1" respectively.

Next, in step S42, a three-state signal is outputted according to the first and second signals, wherein the three-state signal is presented in 1, 0 and −1. Specifically, if the first signal is "1" and the second signal is "0", the three-state signal is determined to be "1". If the first signal is "0" and the second signal is "1", the three-state signal is determined to be "−1". If the first signal is "1" and the second signal is "1", the three-state signal is determined to be "0". If the first signal is "0" and the second signal is "0", the three-state signal is determined to be "0".

Next, in step S44, the result of multiplying the three-state signal by a first parameter is accumulated to obtain an accumulated value, and the result of multiplying the three-state signal by a second parameter is added with the accumulated value to obtain a control bit (at least one bit).

Next, in step S46, the oscillation frequency outputted from the digital phase-locked loop is adjusted based on the control bit.

Figure 1:
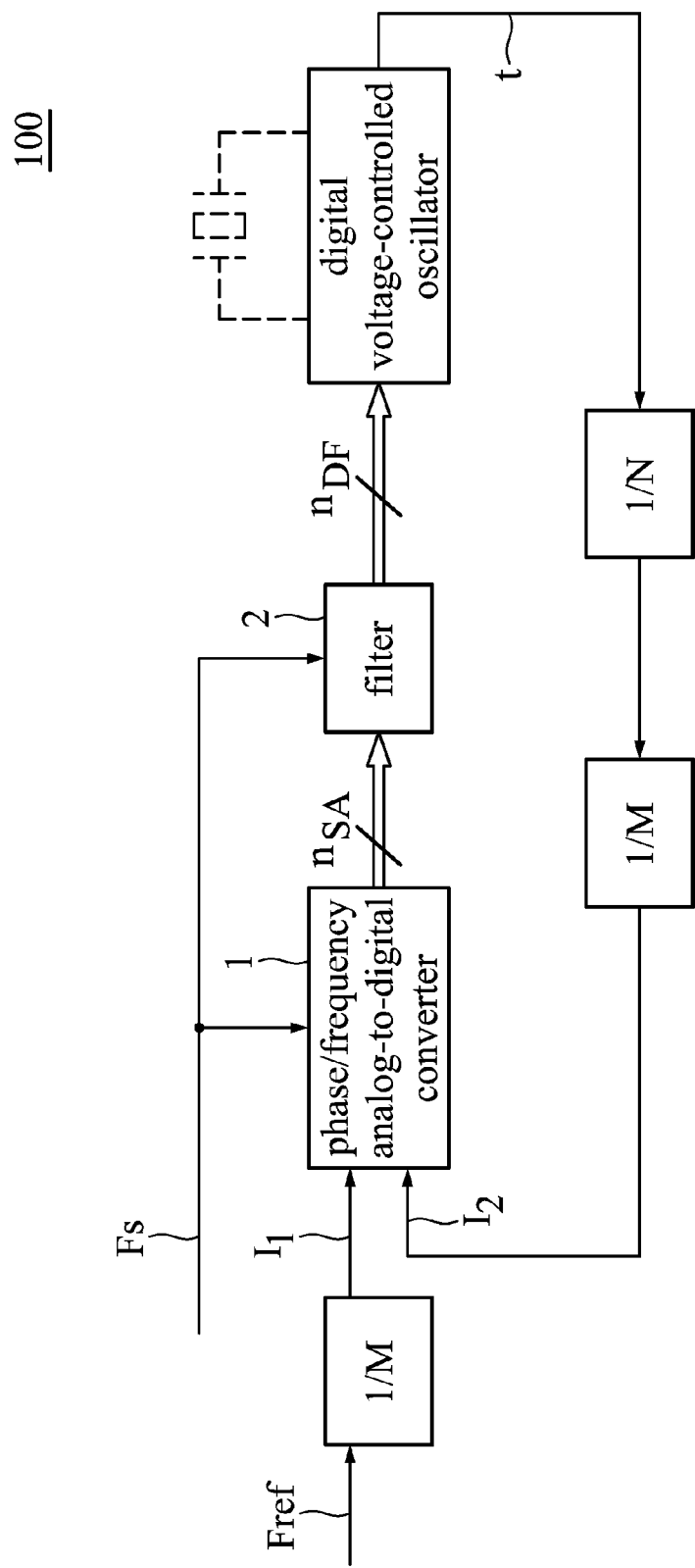
FIG. 1 is a block diagram illustrating a conventional digital phase-locked loop.

Since the digital phase-locked loop 200 of the present invention is configured to receive three-state data, the three-state phase frequency detection converter 22 only requires two bits to represent the three-state signal STATE. In contrast, since the conventional digital phase-locked loop is configured to receive the phase difference value ($\Delta\psi$) between the input frequency Fin and the reference frequency Fref, it requires n bits (nSA shown in FIG. 1) to represent the output value of the phase/frequency analog-to-digital converter 1. Therefore, by using the proposed digital phase-locked loop 200, the circuit complexity of the conventional phase/frequency analog-to-digital converter 1 may be significantly simplified.

Figure 5:
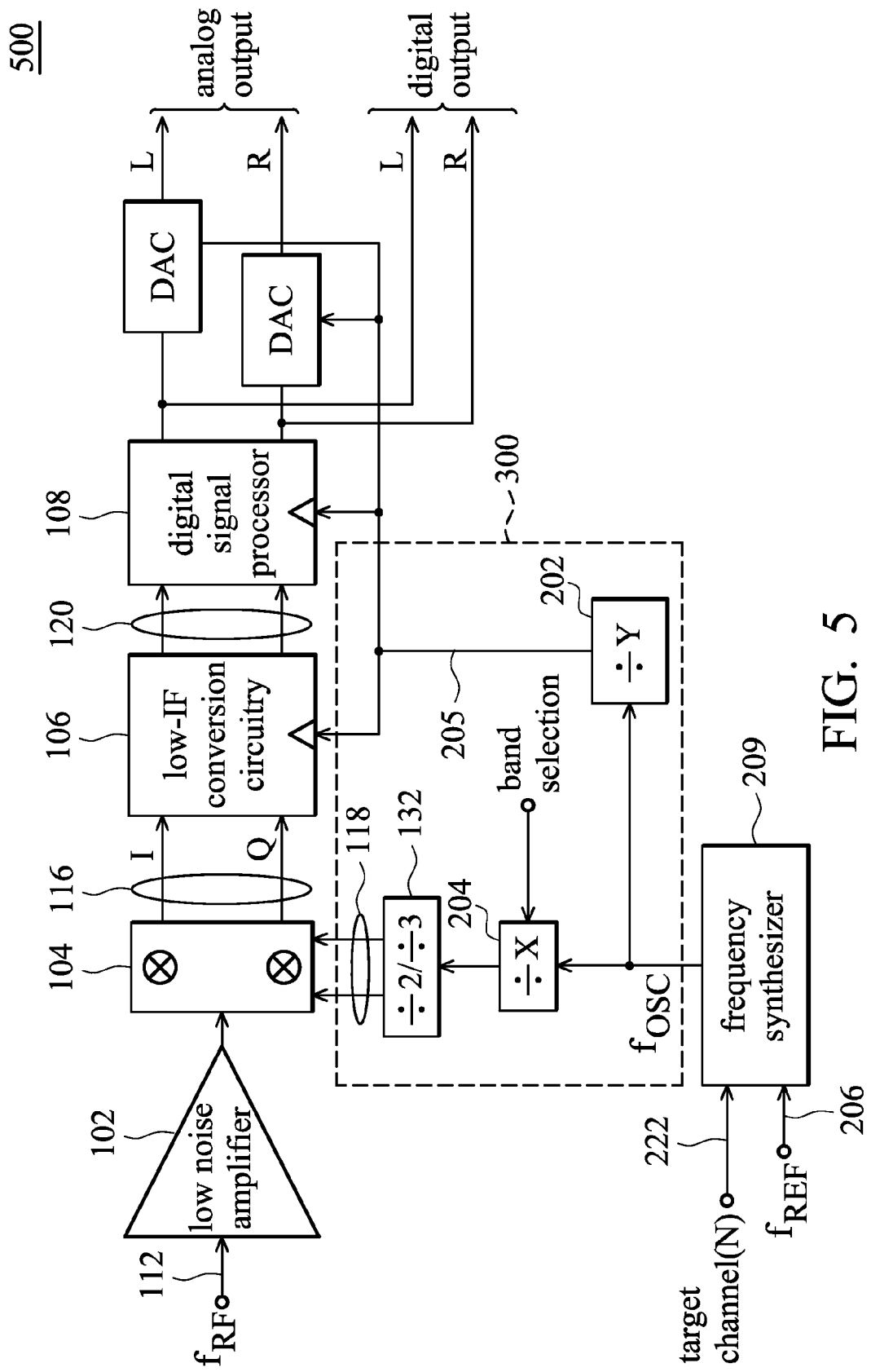
FIG. 5 is a schematic diagram illustrating an embodiment of an integrated receiver according to the present invention.

Furthermore, the proposed digital phase-locked loop 200 may be implemented in an integrated receiver. FIG. 5 is a schematic diagram illustrating an embodiment of an integrated receiver 500 according to the present invention, wherein a low noise amplifier (LNA) 102 is part of an analog receiver path circuitry. The LNA 102 outputs a signal to a mixer 104 based on a received radio frequency signal 112. The mixer 104 generates a low Intermediate Frequency (low-IF) signal 116 to a low-IF conversion circuitry 106 based on a mixed signal 118. The low-IF conversion circuitry 106 digitizes the low-IF signal 116 based on a digital sample clock signal 205, and outputs a digital signal 120 to a digital signal processor (DSP) 108. The DSP 108 processes the digital signal 120 based on a digital clock signal (e.g. digital clock signal 205 in this embodiment, but is not limited thereto). As shown in FIG. 5, the mixed signal 118, digital sample clock signal 205 (for low-IF conversion circuitry 106) and digital clock signal 205 (for DSP 108) are all generated by a clock system 300, wherein the clock system 300 comprises a plurality of dividers 132, 204 and 202. The clock system 300 receives an oscillation frequency $f_{OSC}$ generated by a frequency synthesizer 209 and generates the mixed signal 118, digital sample clock signal 205 and digital clock signal 205 by using the dividers 132, 204 and 202. In the circuit architecture of FIG. 5, the frequency synthesizer 209 may be analogous to the proposed digital phase-locked loop 200, the signal 206 may be analogous to the reference frequency Fref of the proposed digital phase-locked loop 200, and the oscillation frequency $f_{OSC}$ may be analogous to the output oscillation frequency from the DCO 26 of the proposed digital phase-locked loop 200. Since the radio frequency signal 112 in FIG. 5 includes a plurality of adjustable channels, the signal 222 is the target channel to be adjusted. Having been described above, the operation of the proposed digital phase-locked loop 200 will be omitted for brevity in this example.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A digital phase-locked loop, comprising:
    a phase frequency detector, receiving an input frequency and a reference frequency and outputting a first signal and a second signal based on a phase difference between the input frequency and the reference frequency;
    a three-state phase frequency detection converter, outputting a three-state signal according to the first and second signals, wherein the three-state signal is presented in 1, 0 and −1;
    a loop filter, outputting at least one control bit based on only the three-state signal; and
    a digital voltage-controlled oscillator, adjusting an outputted oscillation frequency according to the control bit.

2. The digital phase-locked loop as claimed in claim 1, wherein the loop filter adds a first value with a second value to obtain the control bit, the first value is obtained by accumulating the result of multiplying the three-state signal by a first parameter, and the loop filter multiplies the three-state signal by a second parameter to obtain the second value.

3. The digital phase-locked loop as claimed in claim 1, wherein the loop filter comprises:
    an accumulator unit, comprising:
        a first multiplier, multiplying the three-state signal by a first parameter; and
        a first adder, accumulating an output value of the first multiplier to obtain an output value of the accumulator unit;
    a second multiplier, multiplying the three-state signal by a second parameter; and
    a second adder, adding the output value of the accumulator unit with an output value of the second multiplier to obtain the control bit.

4. The digital phase-locked loop as claimed in claim 1, wherein if the first signal is "1" and the second signal is "0", the three-state signal is determined to be "1"; if the first signal is "0" and the second signal is "1", the three-state signal is determined to be "−1"; if the first signal is "1" and the second signal is "1", the three-state signal is determined to be "0", and if the first signal is "0" and the second signal is "0", the three-state signal is determined to be "0".

5. The digital phase-locked loop as claimed in claim 1, further comprising a first divider for dividing the outputted oscillation frequency by a divisor N to obtain the input frequency.

6. The digital phase-locked loop as claimed in claim 1, further comprising a second divider for dividing a frequency outputted from a crystal oscillator by a divisor M to obtain the reference frequency.

7. The digital phase-locked loop as claimed in claim 6, further comprising a third divider for dividing the frequency outputted from the crystal oscillator by a divisor X to obtain clock frequencies to the three-state phase frequency detection converter and the loop filter.

8. A frequency adjusting method for a digital phase-locked loop, comprising:
    receiving an input frequency and a reference frequency and outputting a first signal and a second signal based on a phase difference between the input frequency and the reference frequency;
    outputting a three-state signal according to the first and second signals, wherein the three-state signal is presented in 1, 0 and −1;
    outputting at least one control bit based on only the three-state signal; and
    adjusting an oscillation frequency outputted from the digital phase-locked loop according to the control bit.

9. The frequency adjusting method as claimed in claim 8, further comprising:
    accumulating the result of multiplying the three-state signal by a first parameter to obtain an accumulated value; and
    adding the result of multiplying the three-state signal by a second parameter with the accumulated value to obtain the control bit.

10. The frequency adjusting method as claimed in claim 8, wherein if the first signal is "1" and the second signal is "0", the three-state signal is determined to be "1"; if the first signal is "0" and the second signal is "1", the three-state signal is determined to be "−1"; if the first signal is "1" and the second signal is "1", the three-state signal is determined to be "0", and if the first signal is "0" and the second signal is "0", the three-state signal is determined to be "0".

11. The frequency adjusting method as claimed in claim 8, further comprising dividing the oscillation frequency by a divisor N to obtain the input frequency.

12. The frequency adjusting method as claimed in claim 8, further comprising dividing a frequency outputted from a crystal oscillator by a divisor M to obtain the reference frequency.

13. The frequency adjusting method as claimed in claim 12, further comprising dividing the frequency outputted from the crystal oscillator by a divisor X to obtain clock frequencies to a three-state phase frequency detection converter for outputting the three-state signal and a loop filter for outputting the control bit.

14. An integrated receiver, comprising:
    an analog receive path circuitry, including a mixer for generating a low IF signal according to a mixed signal;
    a low-IF conversion circuitry, digitizing the low IF signal according to a digital sample clock signal and outputting a digital signal;
    a digital signal processor, processing the digital signal according to the digital clock signal;
    a clock system, receiving an oscillation frequency and generating the mixed signal, and the digital sample clock signal; and
    a frequency synthesizer, comprising:
        a phase frequency detector, receiving an input frequency and a reference frequency and outputting a first signal and a second signal based on a phase difference between the input frequency and the reference frequency;
        a three-state phase frequency detection converter, outputting a three-state signal according to the first and second signals, wherein the three-state signal is presented in 1, 0 and −1;

a loop filter, outputting at least one control bit based on only the three-state signal; and a digital voltage-controlled oscillator, adjusting the oscillation frequency according to the control bit.

15. The integrated receiver as claimed in claim 14, wherein the loop filter adds a first value with a second value to obtain the control bit, the first value is obtained by accumulating the result of multiplying the three-state signal by a first parameter, and the loop filter multiplies the three-state signal by a second parameter to obtain the second value.

16. The integrated receiver as claimed in claim 14, wherein the loop filter comprises:

an accumulator unit, comprising:
a first multiplier, multiplying the three-state signal by a first parameter; and
a first adder, accumulating an output value of the first multiplier to obtain an output value of the accumulator unit;
a second multiplier, multiplying the three-state signal by a second parameter; and
a second adder, adding the output value of the accumulator unit with an output value of the second multiplier to obtain the control bit.

17. The integrated receiver as claimed in claim 14, wherein if the first signal is "1" and the second signal is "0", the three-state signal is determined to be "1"; if the first signal is "0" and the second signal is "1", the three-state signal is determined to be "−1"; if the first signal is "1" and the second signal is "1", the three-state signal is determined to be "0", and if the first signal is "0" and the second signal is "0", the three-state signal is determined to be "0".

18. The integrated receiver as claimed in claim 14, further comprising a first divider for dividing the oscillation frequency by a divisor N to obtain the input frequency.

19. The integrated receiver as claimed in claim 14, further comprising a second divider for dividing a frequency outputted from a crystal oscillator by a divisor M to obtain the reference frequency.

20. The integrated receiver as claimed in claim 19, further comprising a third divider for dividing the frequency outputted from the crystal oscillator by a divisor X to obtain clock frequencies to the three-state phase frequency detection converter and the loop filter.

* * * * *